(12) United States Patent
Chun

(10) Patent No.: US 10,964,783 B2
(45) Date of Patent: Mar. 30, 2021

(54) SEMICONDUCTOR DEVICE

(71) Applicants: Hyundai Motor Company, Seoul (KR); Kia Motors Corporation, Seoul (KR)

(72) Inventor: Dae Hwan Chun, Gwangmyeong-si (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 0 days.

(21) Appl. No.: 16/458,454

(22) Filed: Jul. 1, 2019

(65) Prior Publication Data
US 2020/0185496 A1    Jun. 11, 2020

(30) Foreign Application Priority Data

Dec. 7, 2018   (KR) .................. 10-2018-0157503

(51) Int. Cl.
*H01L 29/06* (2006.01)
*H01L 29/78* (2006.01)
*H01L 29/10* (2006.01)
*H01L 29/16* (2006.01)

(52) U.S. Cl.
CPC ...... *H01L 29/0696* (2013.01); *H01L 29/1095* (2013.01); *H01L 29/1608* (2013.01); *H01L 29/7813* (2013.01)

(58) Field of Classification Search
CPC ............ H01L 29/0696; H01L 29/1608; H01L 29/4238; H01L 29/66734; H01L 29/7813; H01L 29/4236
See application file for complete search history.

(56) References Cited

U.S. PATENT DOCUMENTS

| | | | | |
|---|---|---|---|---|
| 6,060,747 A | * | 5/2000 | Okumura | H01L 29/0696 257/331 |
| 7,075,147 B2 | * | 7/2006 | Cao | H01L 29/0696 257/331 |
| 2013/0277734 A1 | * | 10/2013 | Nishiguchi | H01L 29/0634 257/330 |
| 2014/0183556 A1 | * | 7/2014 | Lee | H01L 29/42312 257/77 |

FOREIGN PATENT DOCUMENTS

WO    WO-2009004583 A1 *  1/2009  ......... H01L 29/4238

* cited by examiner

*Primary Examiner* — Cuong Q Nguyen
*Assistant Examiner* — Peter M Albrecht
(74) *Attorney, Agent, or Firm* — Slater Matsil, LLP

(57) ABSTRACT

A semiconductor device according to an exemplary embodiment of the present disclosure includes a substrate, an n-type layer, a plurality of trenches, a p type region, a p+ type region, an n+ type region, a gate electrode, a source electrode, and a drain electrode. The semiconductor device may include a plurality of unit cells. A unit cell among the plurality of unit cells may include a contact portion with which the source electrode and the n+ type region are in contact, a first branch part disposed above the contact portion on a plane, and a second branch part disposed below the contact portion on a plane, the plurality of trenches are separated from each other and disposed with a stripe shape on a plane.

20 Claims, 8 Drawing Sheets

SEMICONDUCTOR DEVICE

CROSS-REFERENCE TO RELATED APPLICATIONS

This application claims priority to Korean Patent Application No. 10-2018-0157503, filed in the Korean Intellectual Property Office on Dec. 7, 2018, which application is hereby incorporated herein by reference.

TECHNICAL FIELD

The present disclosure relates to a semiconductor device including silicon carbide (SiC).

BACKGROUND

A semiconductor device for electric power needs to have low on-resistance or a low saturation voltage in order to allow a very large current to flow and in order to reduce a power loss in a conduction state. Further, a characteristic of enduring an inverse direction high voltage of a PN conjunction, which is applied to both ends of the semiconductor device for electric power in an off state or at a time at which a switch is turned off, that is, a high breakdown voltage characteristic, is basically required.

A concentration and a thickness of an epitaxial layer or a drift region of a row material to form the power semiconductor device are determined depending on a rated voltage required by a power system. According to Poisson's equation, as the high breakdown voltage of the power semiconductor device is required, the epitaxial layer or the drift region of a low concentration and a thick thickness are needed, however they act as a reason for increasing on resistance and reducing a forward direction current density.

Studies continue to increase the forward current density without adjusting the concentration and thickness of the epitaxial layer or the drift region of the power semiconductor device.

The above information disclosed in this Background section is only for enhancement of understanding of the background of the invention and therefore it may contain information that does not form the prior art that is already known in this country to a person of ordinary skill in the art.

SUMMARY

The present disclosure is directed to a silicon carbide semiconductor device capable of increasing forward current density.

A semiconductor device according to an exemplary embodiment of the present disclosure includes a substrate, an n− type layer, a plurality of trenches, a p type region, a p+ type region, an n+ type region, a gate electrode, a source electrode, and a drain electrode. The semiconductor device includes a plurality of unit cells, one unit cell among the plurality of unit cells includes a contact portion with which the source electrode and the n+ type region are in contact, a first branch part disposed above the contact portion on a plane, and a second branch part disposed below the contact portion on a plane, the plurality of trenches are separated from each other and disposed with a stripe shape on a plane, each of the plurality of trenches includes a protruded part protruded to the left and right on a plane, and the first branch part and the second branch part respectively include the protruded part.

The p+ type region may be disposed at the center of the unit cell on a plane, and the n+ type region may surround the p+ type region in the contact portion on a plane.

The source electrode and the p+ type region may be in contact in the contact portion.

The protruded part included in the first branch part and the protruded part included in the second branch part may be protruded from the trench adjacent to each other on a plane.

Among the plurality of unit cells, the p+ type regions of the unit cells adjacent to the left and right on a plane may not face each other.

The first branch part and the second branch part may respectively include a plurality of the protruded parts.

Among the plurality of unit cells, the p+ type regions of the unit cells adjacent to the left and right on a plane may face each other.

The n− type layer may be disposed at the first surface of the substrate, the plurality of trenches may be disposed at the n− type layer, the p type region may be disposed on the n− type layer and adjacent to the side of the trench, the n+ type region may be disposed on the p type region and adjacent to the side of the trench, and the p+ type region may be disposed on the p type region and adjacent to the side of the n+ type region.

The semiconductor device according to an exemplary embodiment of the present disclosure may further include a gate insulating layer disposed within the plurality of trenches, and a gate electrode maybe disposed on the gate insulating layer.

The semiconductor device according to an exemplary embodiment of the present disclosure may further include an insulating layer disposed on the gate electrode, and the source electrode may be disposed on the insulating layer, the n+ region, and the p+ type region.

The drain electrode may be disposed at a second surface of the substrate.

The substrate may be an n+ type silicon carbide substrate.

The protruded part protruded to the left and right on a plane may be disposed on the same line in each trench.

The protruded part protruded to the left and right on a plane may be periodically disposed in each trench.

According to an exemplary embodiment of the present disclosure, as the branch part of the unit cell includes the protruded part of the trench, the length of the size of the trench within the unit cell may be increased.

Accordingly, the channel length of the semiconductor device may be increased. Therefore, the channel density of the semiconductor device may be improved.

BRIEF DESCRIPTION OF THE DRAWINGS

FIG. 1, which includes

DETAILED DESCRIPTION OF ILLUSTRATIVE EMBODIMENTS

Figures 1A, 1B:
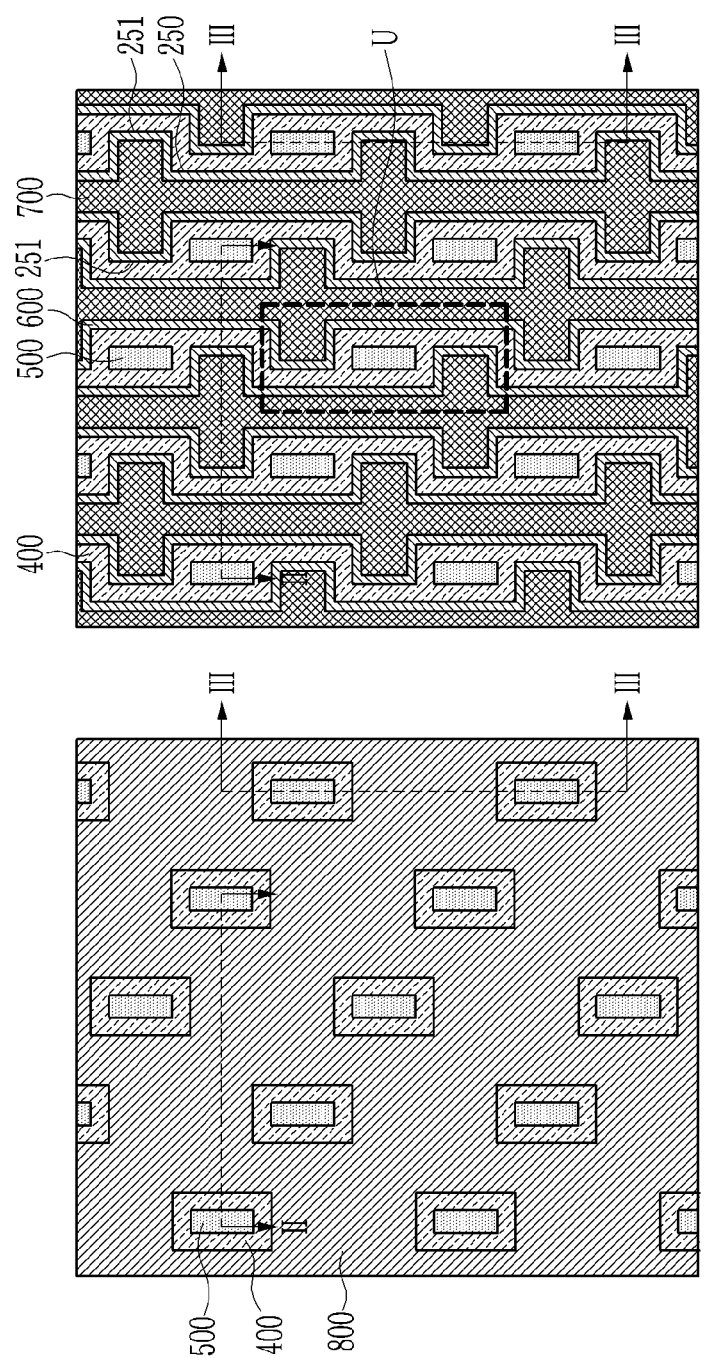
FIGS. 1A and 1B, is a layout view schematically showing an example of a semiconductor device according to an exemplary embodiment of the present disclosure.

Hereinafter, exemplary embodiments of the present disclosure will be described in detail with reference to the accompanying drawings. As those skilled in the art would realize, the described embodiments may be modified in various different ways, all without departing from the spirit or scope of the present disclosure. On the contrary, exemplary embodiments introduced herein are provided to make disclosed contents thorough and complete and to sufficiently transfer the spirit of the present disclosure to those skilled in the art.

In the drawings, the thickness of layers, films, panels, regions, etc., are exaggerated for clarity. It will be understood that when a layer is referred to as being "on" another layer or substrate, it can be directly on the other layer or substrate, or a third layer intervening them may also be present.

Figure 2:
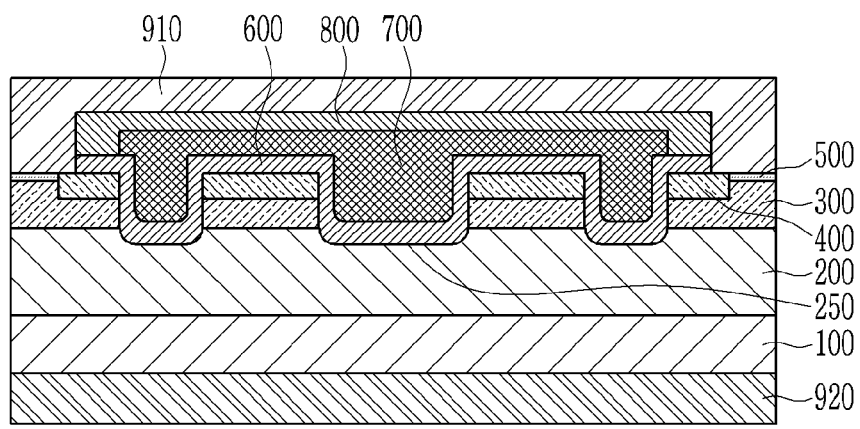
FIG. 2 is a cross-sectional view schematically showing an example taken along line II-II of FIG. 1.
Figure 3:
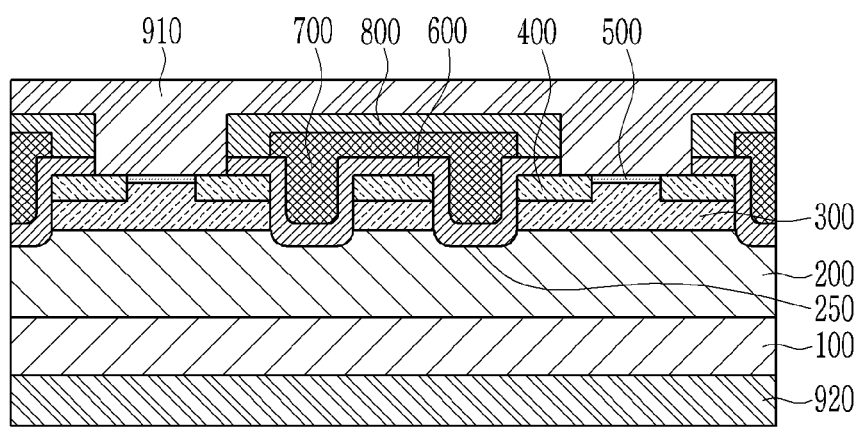
FIG. 3 is a cross-sectional view schematically showing an example taken along line III-III of FIG. 1.

FIG. 1 is a layout view schematically showing an example of a semiconductor device according to an exemplary embodiment of the present disclosure. FIG. 2 is a cross-sectional view schematically showing an example taken along line II-II of FIG. 1. FIG. 3 is a cross-sectional view schematically showing an example taken along line III-III of FIG. 1.

Referring to FIG. 1 to FIG. 3, a semiconductor device according to the present exemplary embodiment includes a substrate 100, an n– type layer 200, a plurality of trenches 250, a p type region 300, an n+ type region 400, a p+ type region 500, a gate electrode 700, a source electrode 910, and a drain electrode 920.

FIG. 1A is a view showing an example of a layout of a semiconductor device of which a source electrode 910 is omitted, and FIG. 1B is a view showing an example of a layout of a semiconductor device of which a part of an insulating layer 800 and a part of the gate electrode 700 are omitted.

The plurality of trenches 250 are spaced apart from each other and positioned in a planar stripe shape, and the gate electrode 700 is disposed within the trench 250. Here, as the gate electrode 700 is disposed within the trench 250, the trench 250 may be defined as a gate trench.

Each trench 250 includes a plurality of protruded parts 251 protruded to the left and right on a plane. Therefore, the width of the portion where the protruded part 251 is located in each trench 250 is wider than the width of the other portions. Here, the protruded parts 251 that are protruded to the left and right on a plane are disposed periodically in each trench 250.

In each trench 250, the protruded part 251 protruded to the left and right on a plane is disposed on the same line on a plane, and does not face the protruded part 251 of the trench 250 disposed adjacent on a plane. That is, in the trenches 250 adjacent to each other, the protruded parts 251 are protruded in a zigzag form on a plane.

The semiconductor device according to the present exemplary embodiment includes a plurality of unit cells U. Each unit cell U is a planar quadrangle and is disposed repeatedly. Each unit cell U contains one p-type region 500, and the p-type region 500 is disposed at the center of each unit cell U on a plane. In each unit cell U, the n+ type region 400 surrounds the p+ type region 500. In the unit cells U adjacent to the left and right on a plane, the p+ type regions 500 do not face. Each unit cell U includes the protruded part 251 of the trench 250. In the present exemplary embodiment, each unit cell U includes the protruded part 251 of the trench 250 respectively disposed above and below the p+ type region 500 on a plane. Here, the protruded part 251 of the trench 250 is disposed one by one above and below the p+ type region 500 on a plane, and the protruded part 251 of the trench 250 respectively disposed above and below of the p+ type region 500 on a plane is protruded from the trenches 250 adjacent to each other.

In each unit cell U, the p+ type region 500 and the n+ type region 400 are in contact with the source electrode 910.

The insulating layer 800 covers the n+ type region 400 and a gate insulating layer 600 and the gate electrode 700 that are disposed within the trench 250 except for the p+ type region 500 and the part of the n+ type region 400 disposed near the p+ type region 500 on a plane.

Next, the detailed structure of the semiconductor device according to the present exemplary embodiment is described.

The n– type layer 200 is disposed on the first surface of the substrate 100, and the trench 250 is disposed in the n– type layer 200. The substrate 100 may be an n+ type silicon carbide substrate.

The p type region 300 is disposed on the n– type layer 200 and is disposed adjacent the side of the trench 250. The n+ type region 400 is disposed above the p type region 300 and is disposed adjacent to the side of the trench 250. The p+ type region 500 is disposed above the p type region 300 and is disposed adjacent to the side of the n+ type region 400.

The gate insulating layer 600 is disposed in the trench 250 and on the portion of the n+ type region 400. The gate electrode 700 is disposed on the gate insulating layer 600. The gate electrode 700 may comprise a metal or a polycrystalline silicon. The gate electrode 700 is disposed to fill the trench 250.

The insulating layer 800 is disposed above the gate electrode 700. The insulating layer 800 covers the side of the gate electrode 700.

The source electrode 910 is disposed on the insulating layer 800, the n+ type region 400, and the p+ type region 500. The source electrode 910 is in contact with the p+ type region 500 and the n+ type region 400. The drain electrode 920 is disposed on the second surface of the substrate 100. The source electrode 910 and the drain electrode 920 may include an ohmic metal. Here, the second surface of the substrate 100 is disposed on the side opposite to the first surface of the n+ type silicon carbide substrate 100.

The channel of the semiconductor device according to the present exemplary embodiment is formed in the p type region 300 disposed adjacent to the side of the trench 250. Each unit cell U of the semiconductor device according to the present exemplary embodiment includes the protruded part 251 of the trench 250 disposed above and below the p+ type region 500 on a plane, thereby the length of the channel of the semiconductor device may be increased. Thus, a channel density of the semiconductor device may be improved.

Next, the unit cell U of the semiconductor device according to an exemplary embodiment of the present disclosure is described with reference to FIG. 4.

Figure 4:
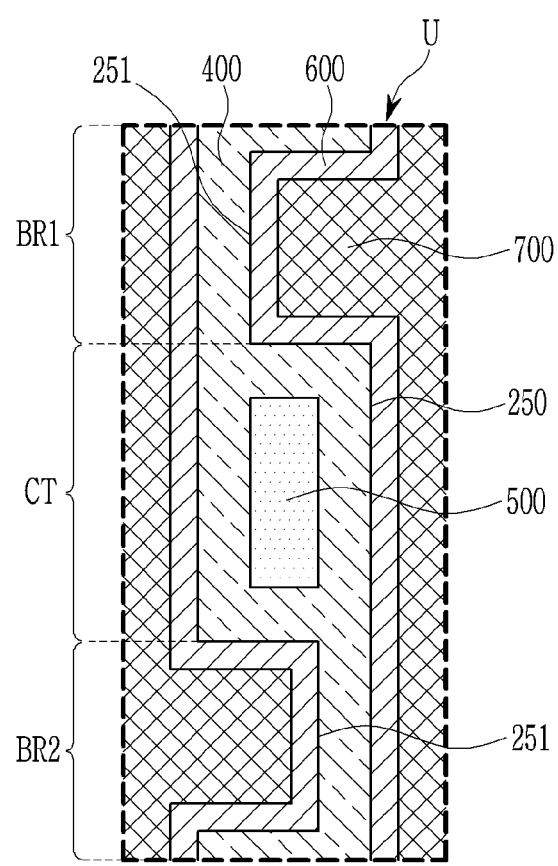
FIG. 4 is a layout view schematically showing an example of a unit cell U of a semiconductor device according to FIG. 1.

FIG. 4 is a layout view schematically showing an example of a unit cell U of a semiconductor device according to FIG. 1. FIG. 4 is the enlarged drawing of the unit cell U of the semiconductor device according to FIG. 1, and as shown in FIG. 1, part of the gate electrode 700, the source electrode 910, and the insulating layer 800 are omitted.

Referring to FIG. 4, the unit cell U is quadrangular on a plane. The unit cell U includes one p+ type region 500, and the p+ type region 500 is disposed at the center part of each unit cell U on a plane. In the unit cell U, the n+ type region 400 surrounds the p+ type region 500. The unit cell U includes the protruded part 251 of the trench 250. In the present exemplary embodiment, the unit cell U includes the protruded part 251 of the trench 250 respectively disposed above and below the p+ type region 500 on a plane. That is, in the present exemplary embodiment, the unit cell U includes the protruded part 251 of two trenches 250.

The unit cell U includes a contact portion CT, a first branch part BR1, and a second branch part BR2. The contact portion CT includes the p+ type region 500 and the n+ type region 400. In the contact portion CT, the p+ type region 500 and the n+ type region 400 are in contact with the source electrode 910. The first branch part BR1 is disposed above the planar contact portion CT, and the second branch part BR2 is disposed below the planar contact portion CT. The first branch part BR1 and the second branch part BR2 respectively include the protruded part 251 of one trench 250.

As above-described, the channel of the semiconductor device according to the present exemplary embodiment is formed in the p type region 300 disposed adjacent to the side of the trench 250, and as the first branch part BR1 and the second branch part BR2 of the unit cell U respectively include the protruded part 251 of the trench 250, the length of the channel of the semiconductor device may be increased. Thus, the channel density of the semiconductor device may be improved.

Next, the channel density of a general semiconductor device and the channel density of the semiconductor device according to an exemplary embodiment of the present disclosure are compared and described with reference to FIG. 5.

In general, the channel density of the semiconductor device is defined as the length of the channel per area of the unit cell on a plane.

Figure 5:
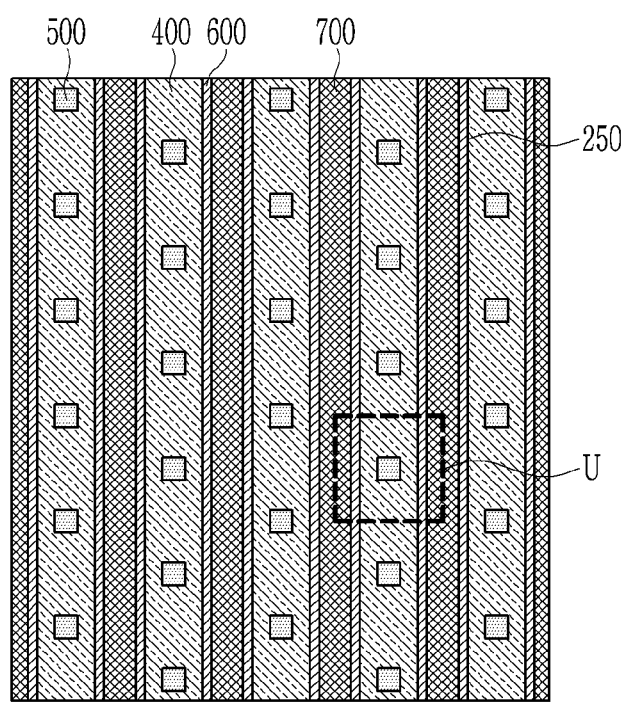
FIG. 5 is a layout view schematically showing a general semiconductor device.

FIG. 5 is a layout view schematically showing a general semiconductor device.

Referring to FIG. 5, the general semiconductor device is a trench gate MOSFET, and the n+ type region 400 and the trench 250 are disassembled into a stripe shape on a plane. The gate insulating layer 600 and the gate electrode 700 are disposed in the trench 250. The channel of the semiconductor device is disposed on the side of the gate trench 250. The general semiconductor device includes the unit cell U, and the unit cell U includes a p+ type region 500 disposed at the center part on a plane. In the unit cells U adjacent to the left and right on a plane, the p+ type regions 500 do not face each other.

When comparing the channel densities of the general semiconductor device (the semiconductor device according to FIG. 5) and the semiconductor device (the semiconductor device according to FIG. 1) according to the present exemplary embodiment, if the area of the unit cell U is the same, in the unit cell U of the semiconductor device according to the present exemplary embodiment, the first branch part BR1 and the second branch part BR2 respectively include the protruded part 251 of the trench 250, so the length of the channel of the semiconductor device may be increased (referring to FIG. 4). That is, it may be confirmed that the length of the channel of the semiconductor device according to the present exemplary embodiment is longer than that of the general semiconductor device.

In the trench gate MOSFET, the channel density is proportional to the forward current density. That is, the increase of the channel density means the increase of the forward current density. Accordingly, in the case of the semiconductor device according to the present exemplary embodiment compared with the general semiconductor device, the area of the semiconductor device for obtaining the same current amount may be reduced by the increase of the current density due to the increase of the channel density. Accordingly, a production cost of the semiconductor device may be reduced and a yield may be improved.

On the other hand, the layout of the semiconductor devices according to the present exemplary embodiment may be various structures. This is described with reference to FIG. 6 to FIG. 8.

Figure 6:
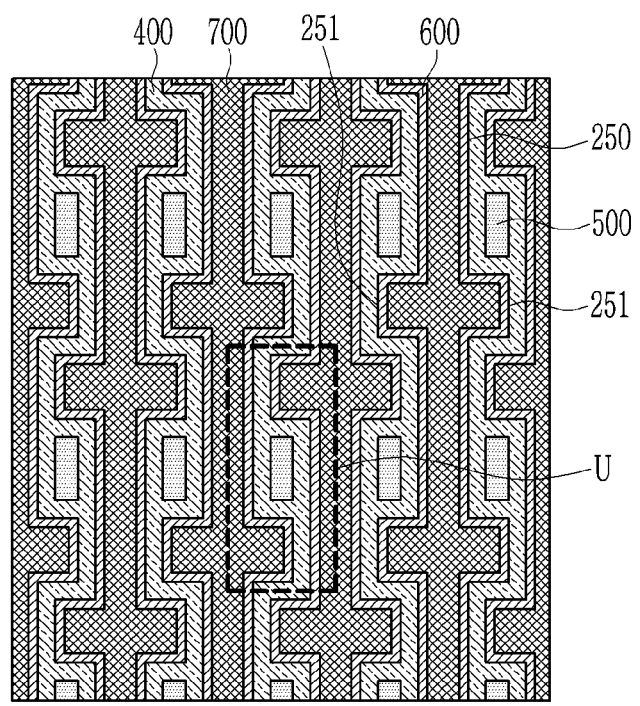
FIG. 6 to FIG. 8 are layout views schematically showing an example of a semiconductor device according to another exemplary embodiment of the present disclosure, respectively.
Figure 7:
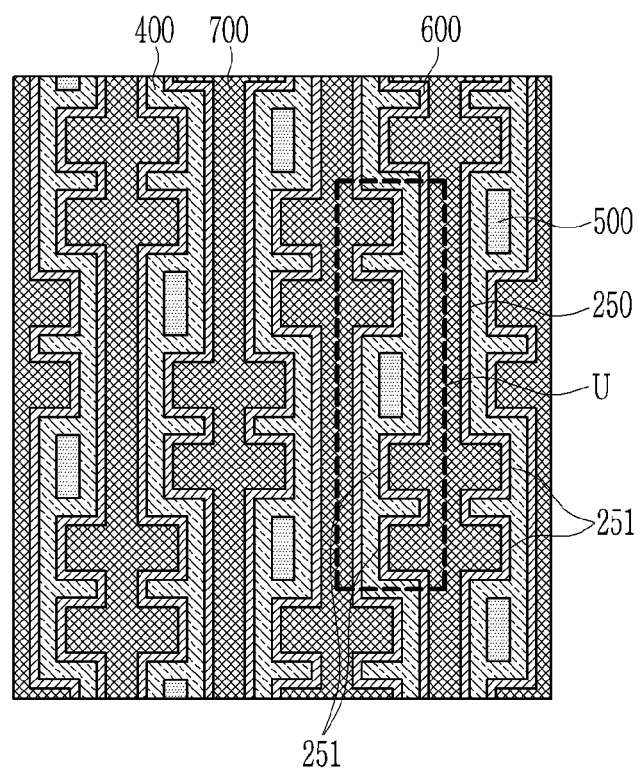
Figure 8:
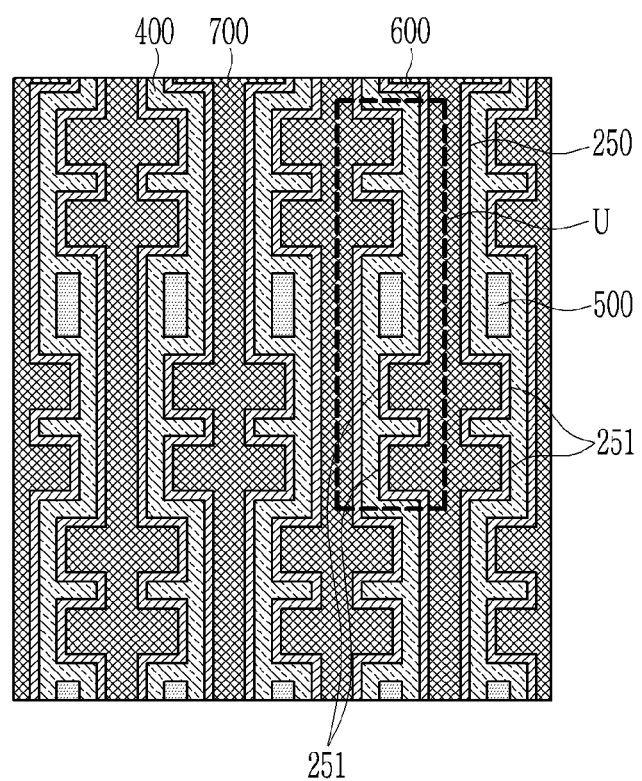

FIG. 6 to FIG. 8 are layout views schematically showing an example of a semiconductor device according to another exemplary embodiment of the present disclosure, respectively.

FIG. 6 to FIG. 8 are drawings showing an example of the layout of the semiconductor device in which the insulating layer 800 and the part of the gate electrode 700 are omitted as shown in FIG. 1B.

Referring to FIG. 6, the semiconductor device according to the present exemplary embodiment is the same as the remaining structure of the semiconductor device according to FIG. 1 except for the arrangement of each unit cell only. The description of the same structure is omitted.

The semiconductor device according to the present exemplary embodiment includes a plurality of unit cells U, the unit cell U is the quadrangle on a plane, and the p+ type region 500 is disposed in the center of the unit cell U on a plane.

In the semiconductor device according to the present exemplary embodiment unlike the semiconductor device according to FIG. 1, in the unit cells U adjacent to each other in the left and right on a plane, the p+ type regions 500 are disposed to face each other.

Referring to FIG. 7, the semiconductor device according to the present exemplary embodiment is the same as the remaining structure of the semiconductor device according to FIG. 1, except for the structure of the unit cell U. The description of the same structure is omitted.

The semiconductor device according to the present exemplary embodiment includes a plurality of unit cells U, the unit cell U is quadrangle on a plane, and the p+ type region 500 is disposed at the center within the unit cell U on a plane.

In the semiconductor device according to the present exemplary embodiment, the unit cell U includes the protruded part 251 of the trench 250 respectively disposed above and below the p+ type region 500 on a plane, unlike the semiconductor device according to FIG. 1, the protruded parts 251 of two trenches 250 are disposed above and below the p+ type region 500 on a plane.

Referring to FIG. 8, the semiconductor device according to the present exemplary embodiment is the same as the remaining structure of the semiconductor device according to FIG. 1, except for the arrangement of each unit cell and the structure of the unit cell U. The description of the same structure is omitted.

The semiconductor device according to the present exemplary embodiment includes a plurality of unit cells U, the unit cell U is quadrangle on a plane, and the p+ type region 500 is disposed at the center within the unit cell U on a plane.

In the semiconductor device according to the present exemplary embodiment, unlike the semiconductor device according to FIG. 1, in the unit cells U adjacent to each other in the left and right on a plane, the p+ type regions 500 are disposed to face each other.

Also, in the semiconductor device according to the present exemplary embodiment, the unit cell U includes the protruded part 251 of the trench 250 respectively disposed above and below the p+ type region 500 on a plane, unlike the semiconductor device according to FIG. 1, the protruded parts 251 of two trenches 250 are respectively disposed above and below the p+ type region 500 on a plane.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

The following references can be used with the drawings.

| 100: substrate | 200: n− type layer |
| --- | --- |
| 250: trench | 251: protruded part |
| 300: p type region | 400: n+ type region |
| 500: p+ type region | 600: gate insulating layer |
| 700: gate electrode | 800: insulating layer |
| 910: source electrode | 920: drain electrode |
| U: unit cell | CT: contact portion |
| BR1: first branch part | BR2: second branch part |

What is claimed is:

1. A semiconductor device comprising:
a substrate, an n− type layer, a plurality of trenches, a p type region, a p+ type region, an n+ type region, a gate electrode, a source electrode, and a drain electrode,
wherein the semiconductor device includes a plurality of unit cells, a unit cell among the plurality of unit cells comprising:
a contact portion with which the source electrode and the n+ type region are in contact;
a first branch part disposed above the contact portion in a plan view; and
a second branch part disposed below the contact portion in the plan view,
wherein the plurality of trenches are separated from each other and disposed with a stripe shape in the plan view;
wherein each of the plurality of trenches includes a protruded part protruded to the left and right in the plan view;
wherein the first branch part includes a plurality of first protruded parts and the second branch part includes a plurality of second protruded parts; and
wherein among the plurality of unit cells, the p+ type regions of laterally adjacent ones of the unit cells in the plan view do not face each other.

2. The semiconductor device of claim 1, wherein
the p+ type region is disposed at the center of the unit cell in the plan view; and
the n+ type region surrounds the p+ type region in the contact portion in the plan view.

3. The semiconductor device of claim 2, wherein the source electrode and the p+ type region are in contact in the contact portion.

4. The semiconductor device of claim 3, wherein the first protruded parts are protruded from a first trench of the plurality of trenches, the second protruded parts are protruded from a second trench of the plurality of trenches, and the first trench and the second trench are adjacent to each other in the plan view.

5. The semiconductor device of claim 1, wherein:
the n− type layer is disposed at a first surface of the substrate;
the plurality of trenches are disposed at the n− type layer;
the p type region is disposed on the n− type layer and adjacent to a side of a corresponding trench of the plurality of trenches;
the n+ type region is disposed on the p type region and adjacent to the side of the corresponding trench; and
the p+ type region is disposed on the p type region and adjacent to a side of the n+ type region.

6. The semiconductor device of claim 5, further comprising a gate insulating layer disposed within the plurality of trenches, the gate electrode being disposed on the gate insulating layer.

7. The semiconductor device of claim 6, further comprising an insulating layer disposed on the gate electrode, the source electrode being disposed on the insulating layer, the n+ type region, and the p+ type region.

8. The semiconductor device of claim 7, wherein the drain electrode is disposed at a second surface of the substrate.

9. The semiconductor device of claim 1, wherein the substrate is an n+ type silicon carbide substrate.

10. The semiconductor device of claim 1, wherein the protruded part protruded to the left and right in the plan view is disposed on the same line in each trench.

11. The semiconductor device of claim 10, wherein the protruded part protruded to the left and right in the plan view is periodically disposed in each trench.

12. A semiconductor device comprising:
a substrate having an upper surface and a lower surface;
an n− type layer overlying the upper surface of the substrate;
a plurality of trenches extending into the n− type layer toward the substrate;
a p type region overlying the n− type layer;
a p+ type region laterally adjacent the p type region;
an n+ type region disposed within the p type region, the p+ type region spaced from a corresponding trench of the plurality of trenches by the n+ type region;
a gate electrode disposed over and within the plurality of trenches;
a source electrode overlying the n+ type region and the gate electrode; and
a drain electrode adjacent the lower surface of the substrate;
wherein the semiconductor device includes a plurality of unit cells, each unit cell comprising a contact portion electrically connecting the source electrode and the n+ type region, a first branch part and a second branch part, the first branch part being laterally spaced from the second branch part by the contact portion;
wherein the plurality of trenches are separated from each other and disposed with a stripe shape, each trench having a first adjacent trench and a second adjacent trench;
wherein each of the plurality of trenches includes a plurality of protruded parts including a first protruded part protruded toward the first adjacent trench and a second protruded part protruded toward the second adjacent trench;

wherein the first branch part of each unit cell includes the first protruded part and the second branch part of each unit cell includes the second protruded part;

wherein the plurality of protruded parts includes a third protruded part protruded toward the first adjacent trench and a fourth protruded part protruded toward the second adjacent trench; and wherein the first branch part of each unit cell further includes the third protruded part and the second branch part of each unit cell further includes the fourth protruded part.

13. The semiconductor device of claim 12, wherein
the p+ type region is disposed at the center of the unit cell in a plan view; and
the n+ type region surrounds the p+ type region in the contact portion in the plan view.

14. The semiconductor device of claim 12, wherein the substrate comprises an n+ type silicon carbide substrate.

15. The semiconductor device of claim 12, wherein among the plurality of unit cells, the p+ type regions of laterally adjacent ones of the unit cells in a plan view do not face each other.

16. A semiconductor device comprising:
a substrate, an n− type layer, a plurality of trenches, a p type region, a p+ type region, an n+ type region, a gate electrode, a source electrode, and a drain electrode,
wherein the semiconductor device includes a plurality of unit cells, a unit cell among the plurality of unit cells comprising:
a contact portion with which the source electrode and the n+ type region are in contact;
a first branch part disposed above the contact portion in a plan view and including a plurality of first protruded parts; and
a second branch part disposed below the contact portion in the plan view and including a plurality of second protruded parts;
wherein the plurality of trenches are separated from each other and disposed with a stripe shape in the plan view; and
wherein each of the plurality of trenches includes a protruded part protruded to the left and right in the plan view.

17. The semiconductor device of claim 16, wherein the substrate is an n+ type silicon carbide substrate.

18. The semiconductor device of claim 17, wherein among the plurality of unit cells, the p+ type regions of laterally adjacent ones of the unit cells in the plan view do not face each other.

19. The semiconductor device of claim 16, wherein among the plurality of unit cells, the p+ type regions of the unit cells adjacent to the left and right on a plane face each other.

20. The semiconductor device of claim 16, wherein
the p+ type region is disposed at the center of the unit cell in the plan view; and
the n+ type region surrounds the p+ type region in the contact portion in the plan view.

\* \* \* \* \*